(12) United States Patent
Ueda et al.

(10) Patent No.: US 7,786,491 B2
(45) Date of Patent: Aug. 31, 2010

(54) SEMICONDUCTOR LIGHT-EMITTING DEVICE COMPRISING A PLURALITY OF SEMICONDUCTOR LAYERS

(75) Inventors: Tetsuzo Ueda, Osaka (JP); Kenji Orita, Osaka (JP)

(73) Assignee: Panasonic Corporation, Osaka (JP)

( * ) Notice: Subject to any disclaimer, the term of this patent is extended or adjusted under 35 U.S.C. 154(b) by 227 days.

(21) Appl. No.: 11/701,427

(22) Filed: Feb. 2, 2007

(65) Prior Publication Data

US 2007/0194327 A1    Aug. 23, 2007

(30) Foreign Application Priority Data

Feb. 2, 2006    (JP)    ............... 2006-026075

(51) Int. Cl.
    *H01L 29/267*    (2006.01)
(52) U.S. Cl. ............... 257/81; 257/82; 257/91; 257/98; 257/100; 257/116; 257/117; 257/432; 257/433; 257/434; 257/437
(58) Field of Classification Search ............ 257/81, 257/82, 91, 98–100, 116, 117, 432–437
    See application file for complete search history.

(56) References Cited

U.S. PATENT DOCUMENTS 5,701,321 A * 12/1997 Hayafuji et al. ........ 372/44.011

FOREIGN PATENT DOCUMENTS

| JP | 2003-86839  |   | 3/2003 |
| JP | 2003-234502 | * | 8/2003 |
| JP | 2004-088083 | * | 3/2004 |
| JP | 2004-88083  |   | 3/2004 |
| JP | 2005-51173  | * | 2/2005 |

OTHER PUBLICATIONS

Ueda, et al., "Vertical InGaN-based blue light emitting diode with plated metal base fabricated using laser lift-off technique," Phys. Stat. Sol. 0, 2003, pp. 2219-2222, No. 7, Wiley-VCH Verlag GmbH & Co. KGaA, Weinheim.
Morita, et al., "High Output Power 365 nm Ultraviolet Light Emitting Diode of GaN-Free Structure," Jpn. J. Appl. Phys., Dec. 2002, pp. 1434-1436, vol. 41, Part 2, No. 12B, The Japan Society of Applied Physics.

* cited by examiner

*Primary Examiner*—Bradley K Smith
*Assistant Examiner*—Mohammad T Karimy
(74) *Attorney, Agent, or Firm*—McDermott Will & Emery LLP

(57) ABSTRACT

A semiconductor light-emitting device includes: a substrate; a plurality of semiconductor layers grown on the substrate and including an active layer; and an electrode formed on the semiconductor layers. An opening in which at least a portion of the semiconductor layers is exposed is formed in the substrate. The electrode faces the opening in the substrate and a portion of the substrate surrounding the opening.

18 Claims, 6 Drawing Sheets

SEMICONDUCTOR LIGHT-EMITTING DEVICE COMPRISING A PLURALITY OF SEMICONDUCTOR LAYERS

CROSS-REFERENCE TO RELATED APPLICATION

The disclosure of Japanese Patent Application No. 2006-26075 filed in Japan on Feb. 2, 2006 including specification, drawings and claims is incorporated herein by reference in its entirety.

BACKGROUND OF THE INVENTION

The present invention relates to a semiconductor light-emitting device applicable to, for example, a short-wavelength light-emitting diode and a method for fabricating-the device.

In the case of GaN, for example, gallium nitride (GaN)-based Group III-V nitride semiconductor has a large band gap of 3.4 eV at room temperature and, therefore, is applicable to light-emitting devices such as visible-range light-emitting diodes and short-wavelength semiconductor laser diodes. Especially for light-emitting diodes, white-light-emitting diodes that emit light by exciting fluorescent materials with blue-green or blue emitted light have been put in practical use for various displays or display apparatus.

GaN-based light-emitting diodes, which are expected to expand their market in future, conventionally use epitaxial layers grown on sapphire substrates by metal organic chemical vapor deposition (MOCVD) to date. As a result of establishment of elemental technology such as: heteroepitaxial growth in which a low-temperature buffer layer is provided on a sapphire substrate; growth of an active layer having a multi-quantum-well structure made of indium gallium nitride (InGaN); and growth of a low-resistance p-type GaN layer by activation annealing, characteristics of the GaN-based light-emitting diodes have been improved.

However, sapphire substrates have various drawbacks such as the absence of conductivity and low heat dissipation, so that reduction of an operating voltage and enhancement of power are limited. To eliminate such various drawbacks of GaN-based light-emitting devices using sapphire substrates, a so-called laser lift-off technique is developed. With this technique, high-power short-wavelength pulse laser light is applied to the surface of a sapphire substrate opposite a GaN-based epitaxial layer, for example, so that a GaN layer near the interface between the substrate and the epitaxial layer is thermally decomposed, thereby separating the epitaxial layer. This enables a light-emitting diode having a vertical structure in which a sapphire substrate is separated to be implemented.

With this structure, if a metal supporting substrate made of, for example, a relatively-thick gold plating material or copper tungsten (CuW) and exhibiting excellent heat dissipation is attached to an epitaxial layer, heat is dissipated through the metal supporting substrate so that power is easily increased. In addition, a vertical electrode structure on which electrodes are formed on both faces of the epitaxial layer is allowed to be adopted, a series resistance and an operating voltage are advantageously reduced. It is expected that employment of a so-called free standing structure in which a substrate for crystal growth is separated is indispensable for enhancement of performance of GaN-based light-emitting diodes in future.

However, the conventional nitride semiconductor light-emitting device with the free standing structure has the following drawbacks. For example, in a light-emitting diode disclosed in T. Ueda et al., Phys. Stat. Sol. 0, No. 7 pp. 2219-2222 (2003), a diode chip is held only by a gold plating material, so that the strength of the diode chip becomes insufficient to cause a crack or other defects of the chip during packaging. In addition, a high-reflectance electrode is provided on a p-type semiconductor layer, so that the light extracting efficiency is enhanced. However, means for extracting light laterally leaked in the chip is not provided, so that increase of luminance is limited.

Further, in a GaN-based light-emitting diode disclosed in, for example, D. Morita et al., Jpn. J. Appl. Phys. 41 pp. L1434-1436 (2002), an epitaxial layer is attached to a supporting substrate made of CuW and then a sapphire substrate for crystal growth is separated. That is, the process step of attaching the supporting substrate to the epitaxial layer is added. Accordingly, cost reduction of the chip is limited.

SUMMARY OF THE INVENTION

It is therefore an object of the present invention to provide a semiconductor light-emitting device using compound semiconductor, and particularly GaN-based compound semiconductor, exhibiting high luminance by increasing the light extracting efficiency with cost reduction and capable of operating with high power by improving heat dissipation.

To achieve the object, a semiconductor light-emitting device according to the present invention has a structure in which semiconductor layers are grown on a substrate for crystal growth and then an opening in which the semiconductor layers are exposed is provided in the substrate so that an electrode having a larger area than the opening is formed on the surface of the semiconductor layers opposite the opening.

In addition, a region of the semiconductor layers exposed in the opening of the substrate has periodic grooves and also has a photonic crystal structure and the electrode facing the opening is a high-reflection electrode, thus greatly increasing the light extracting efficiency. If a thick metal film is used for the electrode, heat dissipation is enhanced through the metal film, thus enabling high-power operation.

Specifically, a semiconductor light-emitting device according to the present invention includes: a substrate; a plurality of semiconductor layers grown on the substrate and including an active layer; and a first electrode formed on the semiconductor layers, wherein a first opening in which at least a portion of the semiconductor layers is exposed is formed in the substrate, the first electrode faces the first opening in the substrate and a portion of the substrate surrounding the first opening, and the area of the first electrode is larger than the area of the firs opening.

In the semiconductor light-emitting device of the present invention, the substrate for growing semiconductor layers are not entirely separated and removed, but an opening for exposing the semiconductor layers is provided in the substrate. Accordingly, the substrate maintains the function of supporting the semiconductor layers. In addition, the first electrode is formed to face the first opening in the substrate and the portion of the substrate surrounding the first opening. Accordingly, when the first electrode is a high-reflection electrode, for example, high luminance is achieved.

It is preferable that in the semiconductor light-emitting device of the present invention, the first electrode is electrically connected to one of the semiconductor layers of a first conductivity type, the semiconductor light-emitting device further includes a second electrode electrically connected to another of the semiconductor layers of a second conductivity type, a second opening is formed in the substrates, and second electrode is extracted to the opposite side from the first electrode through the second opening. Then, the first electrode and the second electrode are formed on respective opposed sides of the semiconductor layers, thus enabling a vertical-type device.

In this case, preferably, the second electrode on the surface of the other semiconductor layer of the second conductivity type has a comb shape in plan view. Then, current injected into the semiconductor layers is uniformly distributed, so that uniform high-luminance light emission is achieved.

In this case, a plurality of said second openings are preferably formed in the substrate. If a plurality of feeding points are provided for the second electrode in this manner, uniform current distribution and uniform light emission are achieved even with an increased chip area.

It is preferable that in the semiconductor light-emitting device of the present invention, the first electrode is electrically connected to one of the semiconductor layers of a first conductivity type, the semiconductor light-emitting device further includes a second electrode electrically connected to another of the semiconductor layers of a second conductivity type, and the second electrode is extracted to the same side as the first electrode. If the first electrode and the second electrode are provided on the same face of the semiconductor layers in this manner, the chip is allowed to be mounted on a board without using wire bonding, for example. In addition, a light radiation pattern free from the influence of a bonding wire and other advantages are achieved. Accordingly, a semiconductor light-emitting device having an excellent light radiation pattern with low fabrication cost is implemented.

In this case, the second electrode is preferably formed in the periphery of the first electrode. Then, injected current is uniformly distributed, so that more-uniform high-luminance light emission is achieved.

In the semiconductor light-emitting device of the present invention, the first electrode is preferably made of a metal having a thickness of 10 μm or more. Then, the function of supporting the semiconductor layers of the first electrode is enhanced, so that cracks and other defects of the chip are less likely to occur during mounting on a board.

In the semiconductor light-emitting device of the present invention, a groove portion is preferably formed in a portion of the semiconductor layers exposed in the first opening. Then, the groove portion of the semiconductor layers allows light emitted from the semiconductor layers and absorbed in the substrate due to reflection at an critical angle or more to be effectively extracted to outside the device. Accordingly, the light extracting efficiency increases, so that a higher-luminance semiconductor light-emitting device is implemented.

In this case, the groove portion preferably forms photonic crystal. Then, the light extracting efficiency is greatly increased.

Further, in this case, the first opening preferably has a tapered shape whose diameter increases as the distance from the semiconductor layers increases. Then, light emitted from the semiconductor layers is reflected on the tapered wall of the first opening and is efficiently extracted in the vertical direction, so that the light extracting efficiency increases.

In the semiconductor light-emitting device of the present invention, a reflection film is preferably formed on an inner wall of the first opening. Then, light emission luminance is further enhanced.

In this case, the reflection film is preferably either a metal film or a multilayer film made of the metal film and an insulating film. Then, deterioration of the reflection film is prevented, so that the reliability is enhanced.

Further, in this case, the metal film preferably contains aluminum. If aluminum having a high reflectance in a wide wavelength range is used for at least a portion of the reflection film in this manner, a semiconductor light-emitting device exhibiting light luminance in a wider wavelength range is implemented.

It is preferable that in the semiconductor light-emitting device of the present invention, the semiconductor layers include a p-type semiconductor layer and an n-type semiconductor layer, and an n-type low-resistance layer to which an impurity is added in a high concentration is interposed between the first electrode and the p-type semiconductor layer. Then, the first electrode is extracted using a tunnel junction. Accordingly, in the case of GaN-based semiconductor having high resistance in a p-type semiconductor layer, for example, current distribution in the lateral direction of the semiconductor layers is promoted, so that a more-uniform high-luminance light emission is achieved.

In this case, the first electrode preferably partially includes a reflection layer containing aluminum. Then, a GaN-based semiconductor light-emitting device having a tunnel junction, for example, is allowed to use high-reflectance aluminum as an ohmic electrode provided in a high-concentration n-type semiconductor layer, so that the high-reflectance electrode increases the light extracting efficiency.

In the semiconductor light-emitting device of the present invention, the semiconductor layers are preferably made of nitride semiconductor. Then, a high-luminance high-power semiconductor light-emitting device which emits light in a wide wavelength range including a visible range and an ultraviolet range or white light is implemented.

In the semiconductor light-emitting device of the present invention, the substrate is preferably made of silicon. Then, since silicon costs less than, for example, sapphire, and a high-luminance low-cost semiconductor light-emitting device capable of operating with high power is implemented.

In this case, the substrate preferably has a principal surface whose plane orientation is a (111) plane. Then, if GaN-based semiconductor is epitaxially grown on a substrate having a principal surface whose plane orientation is a (111) plane, for example, a (0001) plane exhibiting excellent crystallinity is formed on the growth surface of semiconductor layers grown on the substrate. Accordingly, higher luminance and higher-power operation are achieved.

A method for fabricating a semiconductor light-emitting device according to the present invention includes the steps of: (a) forming a groove portion in a principal surface of a substrate; (b) growing a plurality of semiconductor layers including an active layer on the principal surface of the substrate in which the groove portion is formed; (c) forming a first electrode on one of the semiconductor layers of a first conductivity type and forming a second electrode on another of the semiconductor layers of a second conductivity type; and (d) forming, in the substrate, a first opening in which the groove portion is exposed.

With the method of the present invention, a groove portion is formed in a substrate, so that a subsequent process of forming a groove portion in the grown semiconductor layers is unnecessary. In addition, the substrate is not removed from the semiconductor layers, so that the semiconductor layers are supported without any additional process. Accordingly, other process steps such as bonding of another supporting substrate are unnecessary, thus reducing fabrication cost. Moreover, a semiconductor layer onto which the groove portion is transferred is exposed in a first opening formed in the substrate, so that the light extracting efficiency is greatly increased. Furthermore, heat is dissipated through a first electrode, so that higher power operation is achieved.

In the method of the present invention, in the step (d), the first opening is preferably formed to be smaller than the first electrode. Then, when the first electrode is a high-reflectance electrode, for example, high luminance is achieved.

In the method of the present invention, the step (d) preferably further includes the step of forming, in the substrate, a second opening in which the second electrode is exposed. Then, the first electrode and the second electrode are formed on respective both sides of the semiconductor layers, so that a vertical device is implemented.

In the method of the present invention, in the step (d), the first opening is preferably formed to have a tapered shape whose diameter increases as the distance from the semiconductor layers increases. Then, light emitted from the semiconductor layers is reflected on the tapered wall of the first opening and is efficiently extracted in the vertical direction, so that the light extracting efficiency is increased.

In the method of the present invention, the semiconductor layers are preferably made of nitride semiconductor. Then, a high-luminance high-power semiconductor light-emitting device which emits light in a wide wavelength range including a visible range and an ultraviolet range or white light is implemented.

As described above, with a semiconductor light-emitting device and a method for fabricating the device according to the present invention, high luminance is achieved by increasing the light extracting efficiency with cost reduction and high-power operation is achieved due to enhanced heat dissipation.

BRIEF DESCRIPTION OF THE DRAWINGS

FIG. 1A is a plan view and FIG. 1B is a bottom view.

FIG. 4A is a plan view and FIG. 4B is a bottom view.

DETAILED DESCRIPTION OF THE INVENTION

Embodiment 1

A first embodiment of the present invention will be described with reference to the drawings.

Figure 1A:
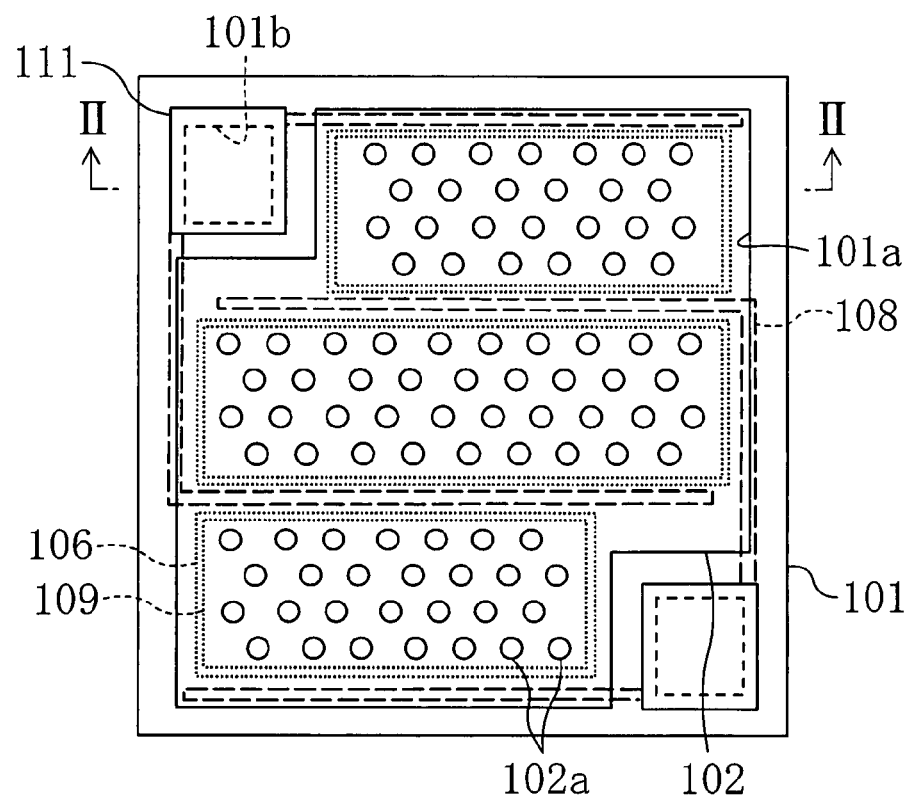
FIGS. 1A and 1B illustrate a semiconductor light-emitting device according to a first embodiment of the present invention.
Figure 1B:
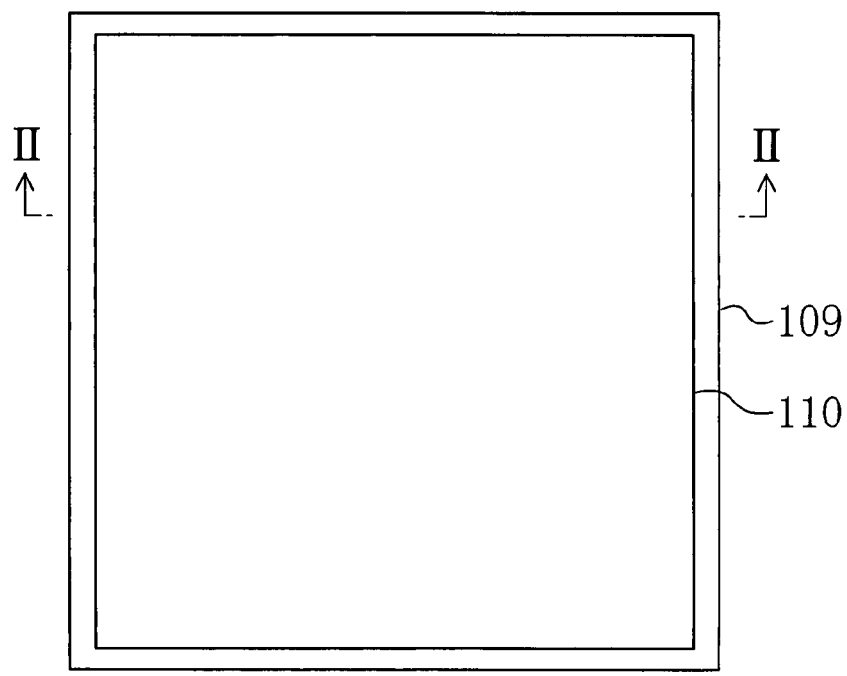
Figure 2:
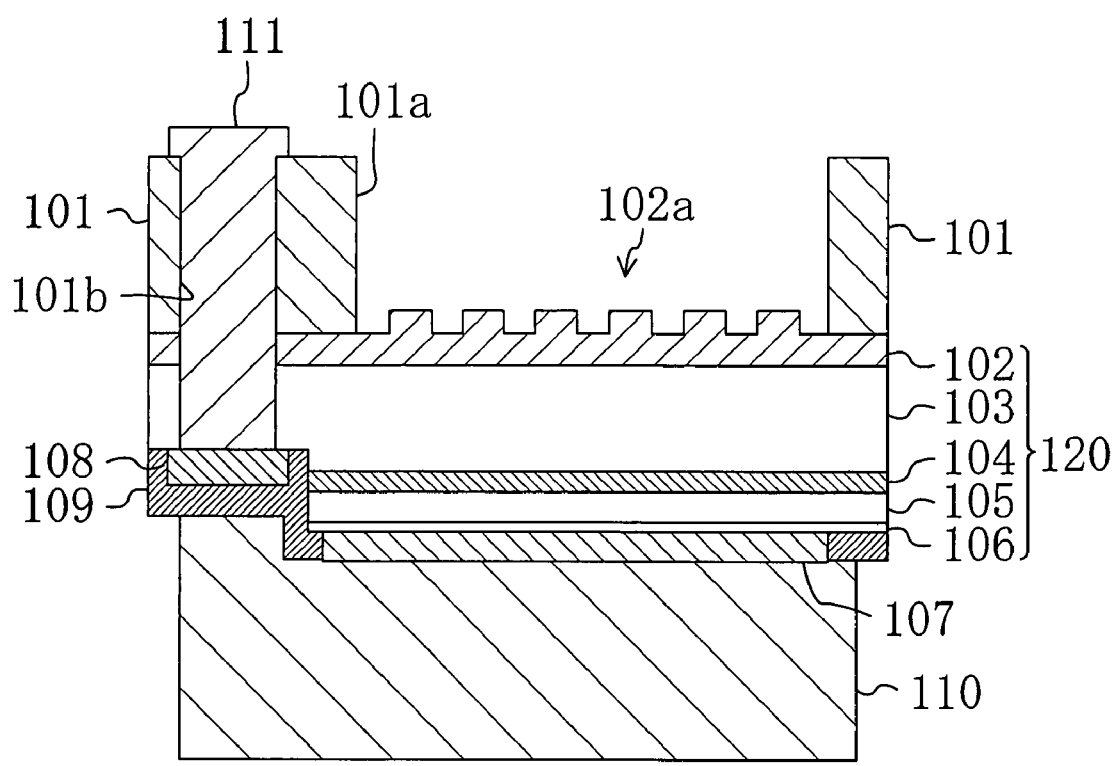
FIG. 2 is a cross-sectional view taken along the line II-II in FIGS. 1A and 1B.

FIGS. 1A and 1B are a plan view and a bottom view, respectively, illustrating a semiconductor light-emitting device according to the first embodiment, and more specifically a GaN-based light-emitting diode capable of emitting, for example, blue or green light having a short wavelength. FIG. 2 is a cross-sectional view taken along the line II-II in FIGS. 1A and 1B.

As illustrated in FIG. 2, for example, a p-side high-reflectance electrode 107 having a thickness of about 200 nm and made of platinum (Pt) is formed on a p-side electrode pad 110 having a thickness of about 30 μm and made of gold (Au) plating. A p-type contact layer 106 having a thickness of 5 nm and made of p-type GaN, a p-type cladding layer 105 having a thickness of 200 nm and made of p-type $Al_{0.1}Ga_{0.9}N$, a multi-quantum-well (MQW) active layer 104 as a stack of three pairs of well layers made of, for example, $Al_{0.35}Ga_{0.65}N$ and barrier layers made of $In_{0.05}Ga_{0.95}N$, an n-type cladding layer 103 having a thickness of 500 nm and made of n-type GaN and a buffer layer 102 having a thickness of 100 nm and made of AlN are formed in this order on the p-side high-reflectance electrode 107, thereby forming an epitaxial semiconductor layer 120. Dents and bumps 102a are regularly formed in the upper surface of the buffer layer 102.

A substrate 101 made of silicon (Si) and having a first opening 101a in which the periodic grooves 102a of the buffer layer 102 are exposed is formed on the buffer layer 102.

Portions of the p-type contact layer 106, the p-type cladding layer 105 and the MQW active layer 104 are selectively removed, thereby exposing the n-type cladding layer 103 at the step formed by this removal. On a region where the n-type cladding layer 103 is exposed, an n-side ohmic electrode 108 in which titanium (Ti) and aluminum (Al) are stacked in this order on the n-type cladding layer 103 is formed. In this embodiment, the n-side ohmic electrode 108 preferably has a comb shape in plan view, as illustrated in FIG. 1A. Then, current injected from the comb-shape n-side ohmic electrode 108 is uniformly distributed so that uniform light emission is obtained.

In addition, as illustrated in FIG. 2, a passivation film 109 having a thickness of, for example, about 300 nm and made of silicon dioxide ($SiO_2$) is formed between the n-side ohmic electrode 108 and the p-side electrode pad 110. This electrically separates the n-side ohmic electrode 108 and the p-side electrode pad 110 from each other.

Since the substrate 101 of the first embodiment has the first opening 101a in which the periodic grooves 102a of the buffer layer 102 are exposed as described above, the substrate 101 is formed only in the periphery of a chip. The substrate 101 is a substrate for crystal growth used in forming an epitaxial semiconductor layer 120, which will be described later. On the epitaxial semiconductor layer 120, the p-side high-reflectance electrode 107, the n-side ohmic electrode 108 and the p-side electrode pad 110 are formed. Then, a center portion of the substrate 101 is removed, thereby forming the first opening 101a. This first opening 101a serves as a portion through which light emitted from the MQW active layer 104 is extracted.

A plurality of through holes (second openings) 101b in which portions of the n-side ohmic electrode 108 are exposed are formed in the substrate 101. An n-side electrode pad 111 made of, for example, Au plating is formed in each of the through holes 101b.

In the first embodiment, the composition of the MQW active layer 104 is determined such that the wavelength of emitted light is about 470 nm. However, if the In content in the well layers is increased or decreased or the well layers are made of quaternary mixed crystal of InAlGaN, the emission wavelength is allowed to be increased to the range from about 340 nm to about 550 nm, for example.

The p-side high-reflectance electrode 107 has a work function which is high enough to obtain excellent ohmic characteristics with the p-type contact layer 106 and may be made of a metal such as rhodium (Rh) or silver (Ag) as long as a sufficiently high reflectance with respect to the emission wavelength is obtained.

As a modified example, an $n^+$-type GaN layer may be provided between the p-type contact layer 106 and the p-side high-reflectance electrode 107 so that a so-called tunnel junction is formed between the p-type contact layer 106 and the n+-type GaN layer. Then, instead of platinum (Pt), aluminum (Al) is allowed to be used for the p-side high-reflectance electrode 107. Since aluminum has a high reflectance in a wider wavelength range, so that a higher-luminance light-emitting diode is obtained.

The periodic grooves 102a of the buffer layer 102 are preferably formed to a depth and under conditions in such a manner that so-called photonic crystal is obtained. When the periodic grooves 102a have a photonic crystal structure, the light extracting efficiency increases so that luminance is further enhanced. For example, in the periodic grooves 102a of the first embodiment, bumps are regularly formed at every 1 μm, are in the shape of cylindrical columns each having a diameter of 0.5 μm and a height of 150 nm and are arranged to form a hexagonal lattice.

The substrate 101 made of silicon (Si) may have any plane orientation as long as GaN-based semiconductor having an excellent crystal structure is formed on the principal surface of the substrate 101. For example, the principal surface of the substrate 101 may be a (111) plane, which is a preferable plane orientation in Si, or a plane having an off angle with respect to the (111) plane.

The substrate 101 made be a compound semiconductor substrate which is easily wet etched, e.g., may be made of gallium arsenide (GaAs). Then, the first opening 101a is easily formed in the substrate 101. If the substrate 101 is made of a material having a lattice constant similar to that of GaN-based semiconductor, e.g., is made of silicon carbide (SiC) or gallium nitride (GaN), crystallinity of the epitaxial semiconductor layer 120 is further enhanced, thus obtaining a higher-luminance light-emitting diode.

In the first embodiment, unlike a conventional substrate made of, for example, sapphire, heat dissipation from the epitaxial semiconductor layer 120 is performed through the p-side electrode pad 110 made of Au plating.

In this manner, in the first embodiment, the substrate 101 for crystal growth is left in the periphery of the chip, so that the substrate 101 has the function of supporting the chip. In addition, the epitaxial semiconductor layer 120, which is the buffer layer 102 in this embodiment, exposed in the first opening 101a formed in the substrate 101 has a photonic crystal structure, so that the light extracting efficiency increases and a higher luminance is obtained. Moreover, as described above, heat dissipation is enabled through the p-side electrode pad 110 made of a relatively-thick metal, so that a light-emitting diode exhibiting greater heat dissipation and capable of operating with high power is implemented. Furthermore, a process step of removing the substrate 101 for crystal growth and then attaching a supporting substrate made of a different material is unnecessary, so that the fabrication cost is reduced.

Hereinafter, a method for fabricating a semiconductor light-emitting device having the foregoing structure will be described with reference to the drawings.

FIGS. 3A through 3F are cross-sectional views showing respective process steps of a method for fabricating a semiconductor light-emitting device according to the first embodiment in the order of fabrication.

Figure 3A:
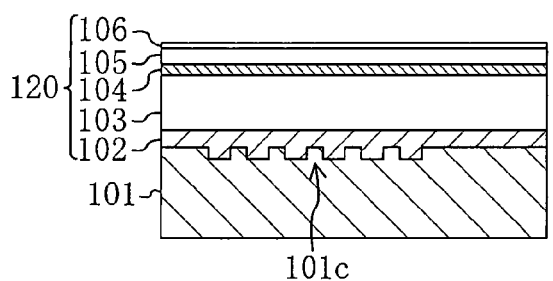
FIGS. 3A through 3F are cross-sectional views showing respective process steps of a method for fabricating a semiconductor light-emitting device according to the first embodiment in the order of fabrication.

First, as shown in FIG. 3A, for example, periodic grooves 101c having a photonic crystal structure are formed by lithography and dry etching in the principal surface of a silicon substrate 101 having a principal surface whose plane orientation is a (111) plane. The photonic crystal structure has a plan configuration illustrated in FIG. 1A and the pitch, the shape and the depth thereof are the same as described above. Specifically, the photonic crystal structure forming the periodic grooves 101c is designed such that the light extracting efficiency is further enhanced. The periodic grooves 101c formed in the substrate 101 are reversely transferred to the grooves 102a which will be formed on the buffer layer 102 in a subsequent step. Subsequently, a buffer layer 102 having a thickness of 100 nm and made of AlN, an n-type cladding layer 103 having a thickness of 500 nm and made of n-type GaN, an MQW active layer 104 including three pairs of well layers made of $In_{0.35}Ga_{0.65}N$ and barrier layers made of $In_{0.05}Ga_{0.95}N$, a p-type cladding layer 105 having a thickness of 200 nm and made of p-type $Al_{0.1}Ga_{0.9}N$ and a p-type contact layer 106 having a thickness of 5 nm and made of p-type GaN, for example, are sequentially grown in this order by a metal organic chemical vapor deposition (MOCVD) process on the principal surface of the substrate 101 where the periodic grooves 101c are formed, thereby forming an epitaxial semiconductor layer 120. At this time, the periodic grooves 101c in the substrate 101 are transferred onto the buffer layer 102, thereby forming periodic grooves 102a. These periodic grooves 102a can also be formed in the n-type cladding layer 103 formed on the buffer layer 102, depending on the thickness of the buffer layer 102.

Figure 3D:
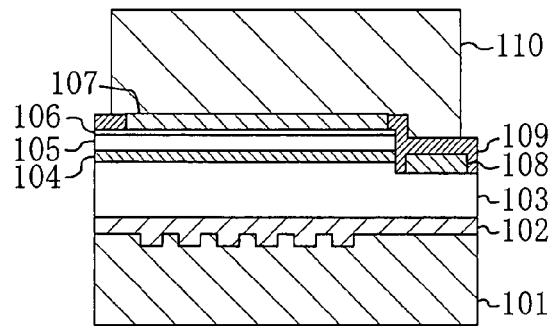
Figure 3B:
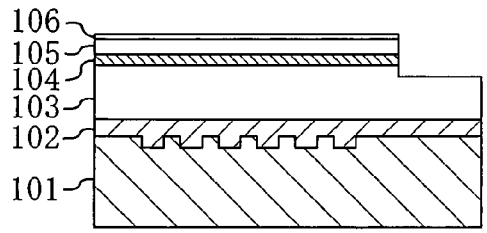

Next, as shown in FIG. 3B, the p-type contact layer 106, the p-type cladding layer 105 and the MQW active layer 104 are sequentially etched by dry etching such as inductively coupled plasma (ICP), thereby selectively exposing the n-type cladding layer 103. Specifically, the n-type cladding layer 103 is exposed in the shape of a comb in plan view, as illustrated in FIG. 1A.

Figure 3E:
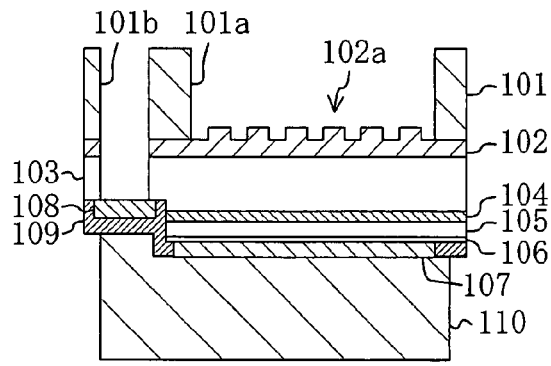
Figure 3C:
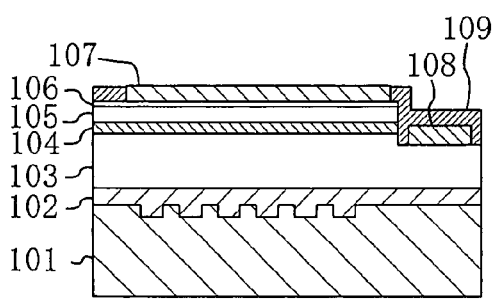

Then, as shown in FIG. 3C, a p-side high-reflectance electrode 107 made of Pt is selectively formed by, for example, sputtering on the p-type contact layer 106. An n-side ohmic electrode 108 made of Ti/Al is selectively formed on the exposed portion of the n-type cladding layer 103. The p-side high-reflectance electrode 107 and the n-side ohmic electrode 108 may be formed in any order. Subsequently, a passivation film 109 having a thickness of 300 nm and made of $SiO_2$ is formed by a chemical vapor deposition (CVD) process over the entire surface of the epitaxial semiconductor layer 120 including the p-side high-reflectance electrode 107 and the n-side ohmic electrode 108. Then, a portion of the passivation film 109 covering the p-side high-reflectance electrode 107 is selectively removed by etching.

Thereafter, as shown in FIG. 3D, a p-side electrode pad 110 having a thickness of about 30 μm and made of Au plating is formed on the p-side high-reflectance electrode 107 and the passivation film 109 by a plating process. At this time, as illustrated in FIG. 1B, a portion of the p-side electrode pad 110 in the periphery of a chip is removed.

Subsequently, as shown in FIG. 3E, a first opening 101a in which the periodic grooves 102a transferred onto the buffer layer 102 are exposed and through holes 101b in which the n-side ohmic electrode 108 is exposed are formed from the surface of the substrate 101 opposite the buffer layer 102. The plan views of the first opening 101a and the through holes 101b are illustrated in FIG. 1A. The first opening 101a and the through holes 101b may be formed in the substrate 101 by, for example, dry etching such as electron cyclotron resonance (ECR) plasma etching using sulfur hexafluoride ($SF_6$) gas or wet etching with a mixed solution of hydrofluoric acid (HF) and nitric acid ($HNO_3$). To form the through holes 101b in the epitaxial semiconductor layer 120, ICP etching using $Cl_2$ may be used.

Figure 3F:
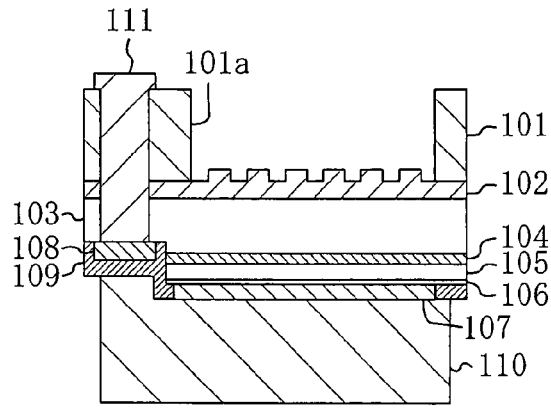

Then, as shown in FIG. 3F, n-side electrode pads 111 are formed by, for example, Au plating to fill the through holes 101b. As illustrated in FIG. 1A, the n-side electrode pads 111 are formed at corners of the chip, for example. In this manner, the n-side electrode pads 111 are preferably formed at positions such that a light-emission region has a large area and the chip is sufficiently supported by the substrate 101.

In the first embodiment, the n-type cladding layer 103 made of n-type GaN is directly provided on the buffer layer 102 made of AlN. Alternatively, multilayer semiconductor having a stacked structure of AlN/GaN or multilayer semiconductor having a stacked structure made of AlGaN and having different compositions may be provided between the buffer layer 102 and the n-type cladding layer 103. Then, the crystallinity of the epitaxial semiconductor layer 120 is enhanced. In this case, to further reduce the series resistance as a light-emitting diode, the multilayer semiconductor having a stacked structure may be doped with an n-type dopant such as silicon (Si) to be n-type multilayer semiconductor having a lower resistance.

With the foregoing process flow, the light-emitting diode structure illustrated in FIGS. 1A and 1B and FIG. 2 is formed.

As another modified example, a substrate made of a material which is different from nitride semiconductor and exhibits excellent heat dissipation, e.g., copper tungsten (CuW), aluminum nitride (AlN) or silicon carbide (SiC) may be attached to the p-side electrode pad 110 before or after the process step of forming the first opening 101a and the through holes 101b in the substrate 101. Then, heat dissipation is further enhanced, so that operation with higher power is achieved.

Embodiment 2

Hereinafter, a second embodiment of the present invention will be described with reference to the drawings.

Figure 4A:
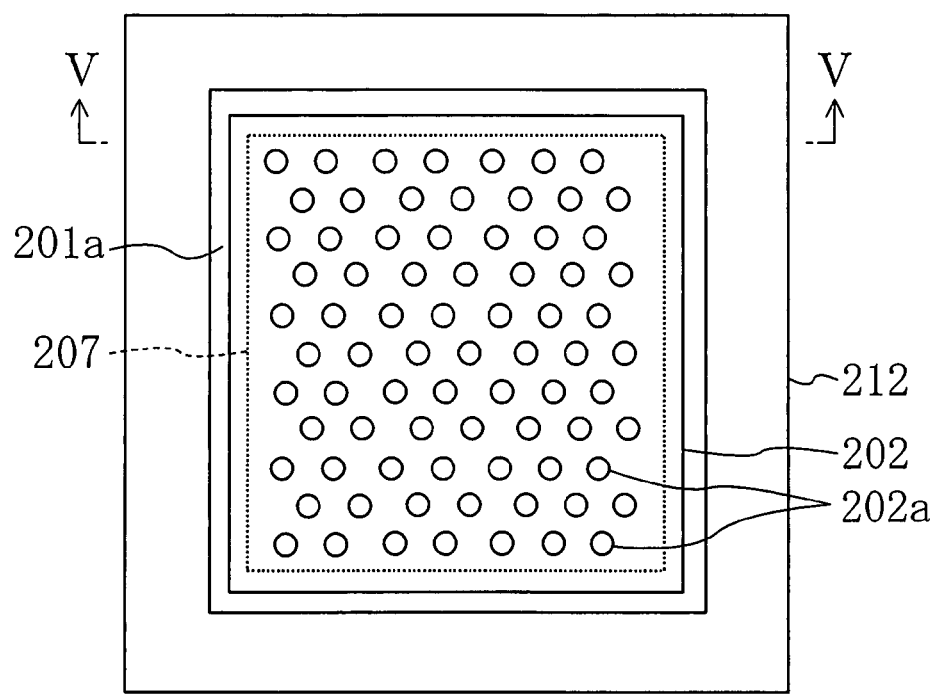
FIGS. 4A and 4B illustrate a semiconductor light-emitting device according to a second embodiment of the present invention.
Figure 4B:
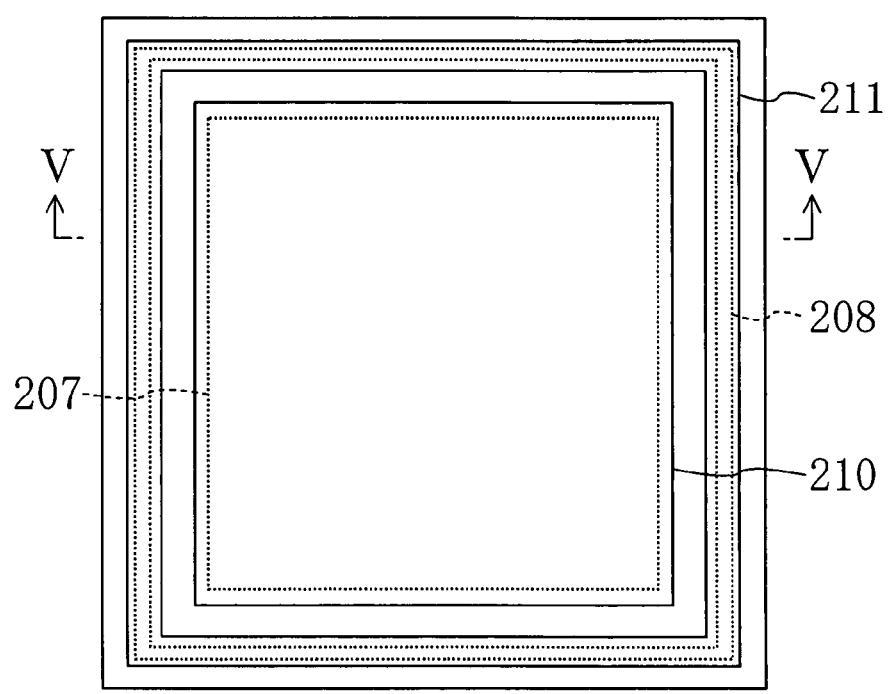
Figure 5:
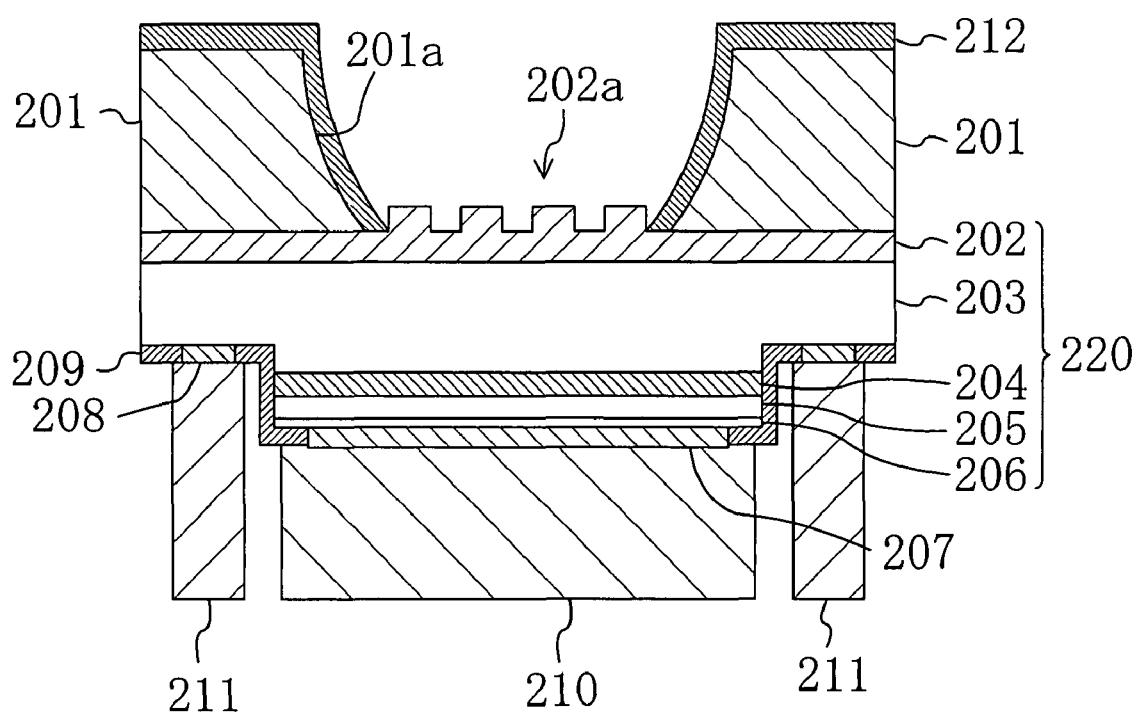
FIG. 5 is a cross-sectional view taken along the line V-V in FIGS. 4A and 4B.

FIGS. 4A and 4B are a plan view and a bottom view, respectively, illustrating a semiconductor light-emitting device according to the second embodiment, and more specifically a GaN-based light-emitting diode capable of emitting, for example, blue or green light having a short wavelength. FIG. 5 is a cross-sectional view taken along the line V-V in FIGS. 4A and 4B.

The semiconductor light-emitting device of the second embodiment is different from the semiconductor light-emitting device of the first embodiment in that an n-side electrode pad 211 and a p-side electrode pad 210 are formed on the same face and that an opening 201a formed in a substrate 201 has a tapered shape in cross section, i.e., the diameter of the opening 201a increases as the distance from the substrate 201 increases. The tapered opening 201a formed in the substrate 201 allows light emitted from a light-emitting region of an epitaxial semiconductor layer 220 to be highly efficiently reflected upward (i.e., toward the direction opposite the p-side electrode pad 210), thus further increasing the light extracting efficiency.

Specifically, as illustrated in FIG. 5, for example, a p-side high-reflectance electrode 207 having a thickness of about 200 nm and made of Pt is formed on the p-side electrode pad 210 having a thickness of about 30 µm and made of Au plating. A p-type contact layer 206 having a thickness of 5 nm and made of p-type GaN, a p-type cladding layer 205 having a thickness of 200 nm and made of p-type $Al_{0.1}Ga_{0.9}N$, an MQW active layer 204 including three pairs of well layers made of, for example, $In_{0.35}Ga_{0.65}N$ and barrier layers made of $In_{0.05}Ga_{0.95}N$, an n-type cladding layer 203 having a thickness of 500 nm and made of n-type GaN and a buffer layer 202 having a thickness of 100 nm and made of AlN are sequentially formed on the p-side high-reflectance electrode 207, thereby forming an epitaxial semiconductor layer 220. Dents and bumps 202a are regularly formed in the upper surface of the buffer layer 202.

A substrate 201 having a tapered shape in cross section, having an opening 201a in which the periodic grooves 202a of the buffer layer 202 are exposed and made of silicon (Si) is formed on the buffer layer 202.

Peripheral portions of the p-type contact layer 206, the p-type cladding layer 205 and the MQW active layer 204 are selectively formed, thereby exposing the n-type cladding layer 203 at the step formed by this removal. On a region where the n-type cladding layer 203 is exposed, an n-side ohmic electrode 208 made of Ti and Al stacked in this order on the n-type cladding layer 203 is formed.

A passivation film 209 having a thickness of, for example, about 300 nm and made of $SiO_2$ is formed between the n-side ohmic electrode 208 and the p-side electrode pad 210. This electrically separates the n-side ohmic electrode 208 and the p-side electrode pad 210 from each other.

As illustrated in FIG. 4B and FIG. 5, an n-side electrode pad 211 made of Au plating is formed in the shape of a ring surrounding the p-side electrode pad 210 on the surface of the n-side ohmic electrode 208 opposite the n-type cladding layer 203.

As described above, since the opening 201a in which the periodic grooves 202a of the buffer layer 202 are exposed is formed in the substrate 201 of the second embodiment, the substrate 201 is formed only in the periphery of a chip. The substrate 201 is a substrate for crystal growth used in forming an epitaxial semiconductor layer 220, which will be described later. On the epitaxial semiconductor layer 220, the p-side high-reflectance electrode 207, the n-side ohmic electrode 208 and the p-side electrode pad 210 are formed. Then, a portion of the substrate 201 is removed, thereby forming the opening 201a. This opening 201a serves as a portion through which light emitted from the MQW active layer 204 is extracted.

As illustrated in FIG. 5, the opening 201a formed in the substrate 201 preferably has a tapered shape which becomes wider toward the top in cross section. Then, light emitted from the MQW active layer 204 is efficiently reflected upward, so that the light extracting efficiency increases. Accordingly, a higher-luminance light-emitting diode is implemented.

In the second embodiment, a reflection film 212 in which Al and $SiO_2$, for example, are stacked in this order is formed on the wall of the opening 201a in the substrate 201 and on the periphery of the substrate 201 so that the reflectance is increased.

In the second embodiment, the composition of the MQW active layer 204 is also determined such that the wavelength of emitted light is about 470 nm. However, if the In content in the well layers is increased or decreased or the well layers are made of quaternary mixed crystal of InAlGaN, the emission wavelength is allowed to be increased to the range from about 340 nm to about 550 nm, for example.

Instead of gold (Au), a metal such as rhodium (Rh) or silver (Ag) may be used for the p-side high-reflectance electrode 207.

The periodic grooves 202a formed in the buffer layer 202 are preferably formed to the depth and under conditions in such a manner that so-called photonic crystal is obtained. For example, in the periodic grooves 202a of the second embodiment, bumps are regularly formed at every 1 µm, are in the shape of cylindrical columns each having a diameter of 0.5 µm and a height of 150 nm and are arranged to form a hexagonal lattice. Then, the light extracting efficiency increases, thus obtaining a higher-luminance light-emitting diode.

The substrate 201 made of silicon may have any plane orientation as long as GaN-based semiconductor having an excellent crystal structure is formed on the principal surface of the substrate 201. For example, the surface of the substrate 201 may be a (111) plane, which is a preferable plane orientation in Si, or a plane having an off angle with respect to the (111) plane.

The substrate 201 may be made of a compound semiconductor substrate which is easily wet etched, e.g., may be made of GaAs. If the substrate 201 is made of a material having a lattice constant similar to that of GaN-based semiconductor, e.g., is made of SiC or GaN, crystallinity of the epitaxial semiconductor layer 220 is further enhanced, thus obtaining a higher-luminance light-emitting diode.

In the second embodiment, unlike a conventional substrate made of, for example, sapphire, heat dissipation from the epitaxial semiconductor layer 220 is performed through the p-side electrode pad 210 made of Au plating and the n-side electrode pad 211.

In this manner, in the second embodiment, the substrate 201 for crystal growth is left in the periphery of the chip, so that the substrate 201 has the function of supporting the chip. In addition, the epitaxial semiconductor layer 220, which is the buffer layer 202 in this embodiment, exposed in the first opening 201a formed in the substrate 201 has a photonic crystal structure, so that the light extracting efficiency increases and a higher luminance is obtained. Moreover, as described above, heat dissipation is enabled through the p-side electrode pad 210 made of a relatively-thick metal and the n-side electrode pad 211, so that a light-emitting diode exhibiting greater heat dissipation and capable of operating with high power is implemented. Furthermore, a process step of removing the substrate 201 for crystal growth and then attaching a supporting substrate made of a different material is unnecessary, so that the fabrication cost is reduced.

Hereinafter, a method for fabricating a semiconductor light-emitting device having the foregoing structure will be described with reference to the drawings.

FIGS. 6A through 6E are cross-sectional views showing respective process steps of a method for fabricating a semiconductor light-emitting device according to the second embodiment in the order of fabrication.

Figure 6A:
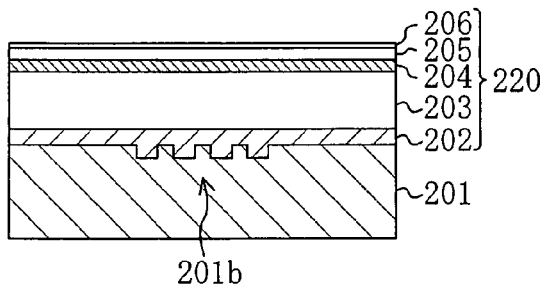
FIGS. 6A through 6E are cross-sectional views showing respective process steps of a method for fabricating a semiconductor light-emitting device according to the second embodiment in the order of fabrication.

First, as shown in FIG. 6A, for example, periodic grooves 201b having a photonic crystal structure are formed by lithography and dry etching in the principal surface of a silicon substrate 201 whose surface orientation is a (111) plane. The photonic crystal structure has a plan configuration illustrated in FIG. 4A and the pitch, the shape and the depth thereof are the same as those described in the first embodiment. Specifically, the photonic crystal structure forming the periodic grooves 201b is designed such that the light extracting efficiency is further enhanced. The periodic grooves 201b formed in the substrate 201 are reversely transferred to the periodic grooves 202a which will be formed on the buffer layer 202 in a subsequent step. Subsequently, a buffer layer 202 having a thickness of 100 nm and made of AlN, an n-type cladding layer 203 having a thickness of 500 nm and made of n-type GaN, an MQW active layer 204 including three pairs of well layers made of $In_{0.35}Ga_{0.65}N$ and barrier layers made of $In_{0.05}Ga_{0.95}N$, a p-type cladding layer 205 having a thickness of 200 nm and made of p-type $Al_{0.1}Ga_{0.9}N$ and a p-type contact layer 206 having a thickness of 5 nm and made of p-type GaN, for example, are sequentially grown in this order by an MOCVD process on the principal surface of the substrate 201 where the periodic grooves 201b are formed, thereby forming an epitaxial semiconductor layer 220. At this time, the periodic grooves 201a of the substrate 201 are transferred onto the buffer layer 202, thereby forming periodic grooves 202a. These periodic grooves 202a can also be formed in the n-type cladding layer 203 formed on the buffer layer 202, depending on the thickness of the buffer layer 202.

Figure 6B:
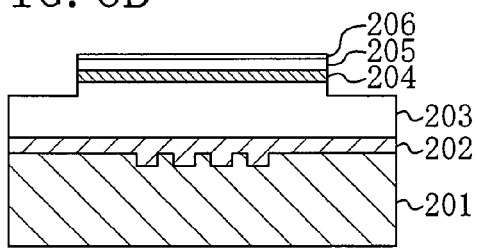

Next, as shown in FIG. 6B, the p-type contact layer 206, the p-type cladding layer 205 and the MQW active layer 204 are sequentially etched by dry etching such as ICP etching, thereby selectively exposing the n-type cladding layer 203. Specifically, the periphery of the chip is exposed in the shape of a ring, as illustrated in FIG. 4B.

Figure 6C:
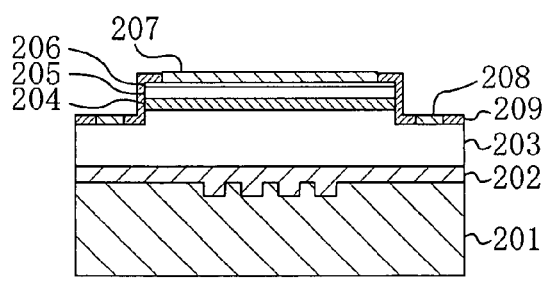

Then, as shown in FIG. 6C, the p-side high-reflectance electrode 207 made of Pt is selectively formed by, for example, sputtering on the p-type contact layer 206. An n-side ohmic electrode 208 made of Ti/Al is selectively formed on the n-type cladding layer 203 exposed in the shape of a ring. The p-side high-reflectance electrode 207 and the n-side ohmic electrode 208 may be formed in any order. Subsequently, a passivation film 209 having a thickness of 300 nm and made of $SiO_2$ is formed by a CVD process over the entire surface of the epitaxial semiconductor layer 220 including the p-side high-reflectance electrode 207 and the n-side ohmic electrode 208. Then, a portion of the passivation film 209 covering the p-side high-reflectance electrode 207 and the n-side ohmic electrode 208 is selectively removed by etching.

Figure 6D:
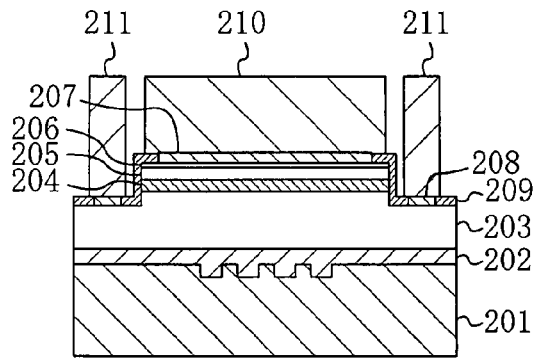

Thereafter, as shown in FIG. 6D, a p-side electrode pad 210 having a thickness of about 30 μm and made of Au plating is formed and an n-side electrode pad 211 is formed around the p-side electrode pad 210, on the p-side high-reflectance electrode 207 and the n-side ohmic electrode 208 by a plating process.

Figure 6E:
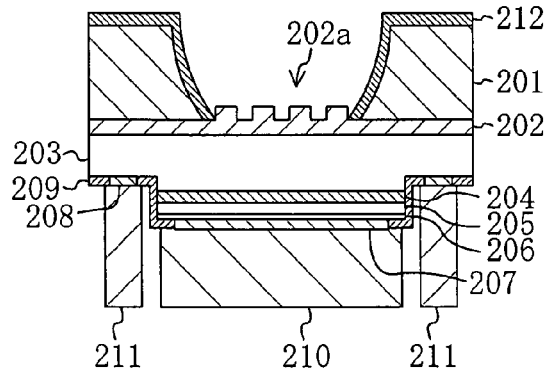

Subsequently, as shown in FIG. 6E, an opening 201a which has a tapered shape in cross section and in which the periodic grooves 202a transferred onto the buffer layer 202 are exposed is formed from the surface of the substrate 201 opposite the buffer layer 202. The opening 201a can be formed by, for example, dry etching such as ECR plasma etching or wet etching with a mixed solution of HF and $HNO_3$ used in the first embodiment. However, in the second embodiment, since the opening 201a has a tapered shape which becomes wider toward the top in cross section, when dry etching is used, the pressure during, for example, etching is preferably set higher than that in an ordinary case in order to facilitate chemical reaction. If a resist film itself used as an etching mask is formed to have a tapered shape in cross section, the opening 201a is also allowed to have a tapered shape.

Then, a metal film made of Al is selectively deposited by, for example, a sputtering process over the upper surface of the substrate 201 and the inner wall of the opening 201a, and then an insulating film made of $SiO_2$ is selectively deposited by a CVD process, thereby forming a reflection film 212 out of the metal film and the insulating film. In this embodiment, the metal film made of Al is used for the reflection film 212. However, instead of Al, silver (Ag) or gold (Au), for example, may be used for the reflection film 212 as long as a sufficiently high reflectance with respect to the emission wavelength is obtained. The insulating film on the metal film is formed to prevent deterioration of the metal film and may be made of another insulating film (dielectric film) such as a silicon nitride (SiN) film instead of $SiO_2$ as long as emitted light passes therethrough.

In the second embodiment, to enhance crystallinity of, for example, the MQW active layer 204, multilayer semiconductor having a stacked structure of AlN/GaN or multilayer semiconductor having a stacked structure made of AlGaN and having different compositions may also be provided between the buffer layer 202 and the n-type cladding layer 203.

With the foregoing process flow, the light-emitting diode structure illustrated in FIGS. 4A and 4B and FIG. 5 is formed.

As another modified example, a substrate made of a material which is different from nitride semiconductor and exhibits excellent heat dissipation, e.g., CuW, AlN or SiC may be attached to the p-side electrode pad 210 before or after the process step of forming the opening 201a in the substrate 201. Then, heat dissipation is further enhanced, so that operation with higher output is enabled.

In the first and second embodiments, compound semiconductor forming a light-emitting diode structure is not limited to Group-III nitride and may be any semiconductor such as gallium arsenide (GaAs) or indium phosphide (InP) as long as a light-emitting diode structure is implemented.

The substrate for the growth of an epitaxial semiconductor layer may be any type of a substrate as long as the substrate allows excellent crystal growth and has high processability. The plane orientation of the principal surface of the substrate is not specifically limited and may have an off angle with respect to a typical plane orientation.

The method for crystal growth of the epitaxial semiconductor layer is not limited to an MOCVD process, and may be a molecular beam epitaxy (MBE) process or a hydride vapor phase epitaxy (HVPE) process. Alternatively, an MBE or HVPE process may be used for a portion of the semiconductor layers.

As described above, a semiconductor light-emitting device and a method for fabricating the device according to the present invention provide higher luminance by increasing the light extracting efficiency with cost reduction and also provide high-power operation with enhanced heat dissipation. Accordingly, the present invention is useful for, for example, a semiconductor light-emitting diode capable of generating light in a visible range or an ultraviolet range or white light.

What is claimed is:

1. A semiconductor light-emitting device, comprising:
a substrate;
a plurality of semiconductor layers grown on the substrate and including an active layer; and
a first electrode formed on the semiconductor layers,
wherein the substrate includes a first opening in which at least a portion of the semiconductor layers is exposed,
the first electrode covers at least a portion of the first opening in the substrate and faces a portion of the substrate surrounding the first opening,
the first electrode is electrically connected to one of the semiconductor layers of a first conductivity type,
the semiconductor light-emitting device further comprises a second electrode electrically connected to another of the semiconductor layers of a second conductivity type,
the substrate and the another of the semiconductor layers of the second conductivity type includes a second opening,
the second opening is located at a different portion of the substrate from the portion of the substrate at which the first opening is located, and
the second electrode penetrates the substrate and the another of the semiconductor layers of the second conductivity type through the second opening.

2. The semiconductor light-emitting device of claim 1, wherein the second electrode on the surface of the other semiconductor layer of the second conductivity type has a comb shape in plan view.

3. The semiconductor light-emitting device of claim 1, wherein a plurality of said second openings are formed in the substrate.

4. The semiconductor light-emitting device of claim 1, wherein the first electrode is electrically connected to one of the semiconductor layers of a first conductivity type,
the semiconductor light-emitting device further comprises a second electrode electrically connected to another of the semiconductor layers of a second conductivity type, and
the second electrode is extracted to the same side as the first electrode.

5. The semiconductor light-emitting device of claim 4, wherein the second electrode is formed in the periphery of the first electrode.

6. The semiconductor light-emitting device of claim 1, wherein the first electrode is made of a metal having a thickness of 10 μm or more.

7. The semiconductor light-emitting device of claim 1, wherein a groove portion is formed in a portion of the semiconductor layers exposed in the first opening.

8. The semiconductor light-emitting device of claim 7, wherein the groove portion forms photonic crystal.

9. The semiconductor light-emitting device of claim 1, wherein the first opening has a tapered shape whose diameter increases as the distance from the semiconductor layers increases.

10. The semiconductor light-emitting device of claim 1, wherein a reflection film is formed on an inner wall of the first opening.

11. The semiconductor light-emitting device of claim 10, wherein the reflection film is either a metal film or a multilayer film made of the metal film and an insulating film.

12. The semiconductor light-emitting device of claim 11, wherein the metal film contains aluminum.

13. The semiconductor light-emitting device of claim 1, wherein the semiconductor layers include a p-type semiconductor layer and an n-type semiconductor layer, and
an n-type low-resistance layer to which an impurity is added in a high concentration is interposed between the first electrode and the p-type semiconductor layer.

14. The semiconductor light-emitting device of claim 13, wherein the first electrode partially includes a reflection layer containing aluminum.

15. The semiconductor light-emitting device of claim 1, wherein the semiconductor layers are made of nitride semiconductor.

16. The semiconductor light-emitting device of claim 1, wherein the substrate is made of silicon.

17. The semiconductor light-emitting device of claim 16, wherein the substrate has a principal surface whose plane orientation is a (111) plane.

18. The semiconductor light-emitting device of claim 1, wherein the first electrode reflects light emitted from the active layer toward the first opening.

* * * * *